US008873656B2

(12) United States Patent
Lomayev et al.

(10) Patent No.: US 8,873,656 B2
(45) Date of Patent: Oct. 28, 2014

(54) DEVICE, SYSTEM AND METHOD OF PROCESSING SINGLE-CARRIER WIRELESS COMMUNICATION SIGNALS

(75) Inventors: Artyom Lomayev, Nizhny Novgorod (RU); Alexander Maltsev, Nizhny Novgorod (RU); Assaf Kasher, Haifa (IL); Menashe Soffer, Herzliya (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,748

(22) PCT Filed: Aug. 19, 2011

(86) PCT No.: PCT/US2011/048492
§ 371 (c)(1),
(2), (4) Date: Jun. 25, 2013

(87) PCT Pub. No.: WO2010/028161
PCT Pub. Date: Feb. 28, 2013

(65) Prior Publication Data
US 2013/0272461 A1  Oct. 17, 2013

(51) Int. Cl.
*H04K 1/10* (2006.01)
*H04L 27/28* (2006.01)
*H04B 1/00* (2006.01)
*H04L 27/26* (2006.01)
*H03D 7/00* (2006.01)
*H04L 27/00* (2006.01)
*H04L 5/00* (2006.01)

(52) U.S. Cl.
CPC ............ *H04L 27/265* (2013.01); *H04B 1/0007* (2013.01); *H03D 7/00* (2013.01); *H04L 27/0008* (2013.01); *H04L 5/00* (2013.01); *H04L 27/2647* (2013.01)
USPC ........................................... 375/260; 455/203

(58) Field of Classification Search
USPC ..................... 375/260, 338–339; 455/203
See application file for complete search history.

(56) References Cited

U.S. PATENT DOCUMENTS

| 2003/0016166 A1 | 1/2003 | Jandrell |
| 2003/0081689 A1* | 5/2003 | Saito .............................. 375/260 |
| 2007/0064824 A1 | 3/2007 | Wang et al. |
| 2010/0002816 A1 | 1/2010 | Mody et al. |
| 2011/0051825 A1 | 3/2011 | Tao et al. |

OTHER PUBLICATIONS

Wireless Gigabit Alliance (WGA) Specifications; WiGig MAC and PHY Specification Version 1.0, Apr. 2010—Final Specification; 311 pages.

(Continued)

*Primary Examiner* — Curtis Odom
(74) *Attorney, Agent, or Firm* — Shichrur & Co.

(57) ABSTRACT

Some demonstrative embodiments include devices, systems and/or methods of processing single-carrier wireless communication signal. For example, a device may include a receiver to receive an analog single-carrier wireless communication signal representing a first plurality of time-domain samples at a first sampling rate; to convert the analog single-carrier wireless communication signal into a digital signal including a second plurality of time-domain samples at a second sampling rate, which is greater than the first sampling rate; to convert the second plurality of time-domain samples into a first plurality of frequency-domain samples; and to map the first plurality of frequency-domain samples into a second plurality of frequency-domain samples at the first sampling rate.

19 Claims, 4 Drawing Sheets

(56) References Cited

OTHER PUBLICATIONS

IEEE Std 802.11™—007 (Revision of IEEE Std 802.Nov. 1999) IEEE Standard for Information technology—Telecommunications and information exchange between systems—Local and metropolitan area networks—Specific requirements. Part 11: Wireless LAN Medium Access Control (MAC) and Physical Layer (PHY) Specifications.

Harald Witschnig et al., "A Comparison of an OFDM System and a Single Carrier System Using Frequency Domain Equalization", Multi-Carrier Spread-Spectrum and Related Topics, vol. 13, No. 5, Sep.-Oct. 2002, Austria; 12 pages.

Carlos Cordeiro, Intel, et al.;IEEE P802.11-10/0433r2, IEEE P802.11 Wireless LANs, PHY/MAC Complete Proposal Specification, May 2010; 336 pages.

Eldad Perahia, et al.; "IEEE 802.11ad: Defining the Next Generation Multi-Gbps Wi-Fi" Communications and Networking Conference (CCNC), 2010 7th IEEE, Jan. 9-12, 2010; 5 pages.

Heinrich Meyr et al, "Digital Communication Receivers" Wiley Series in Telecommunications and Signal Processing 1998; Chapter 2—Baseband Communications; 6 pages.

International Search Report and Written Opinion for PCT/US2011/048492, mailed on Feb. 23, 2012; 9 pages.

International Preliminary Report on Patentability for PCT Application No. PCT/US2011/048492, mailed on Mar. 6, 2014, 6 pages.

\* cited by examiner

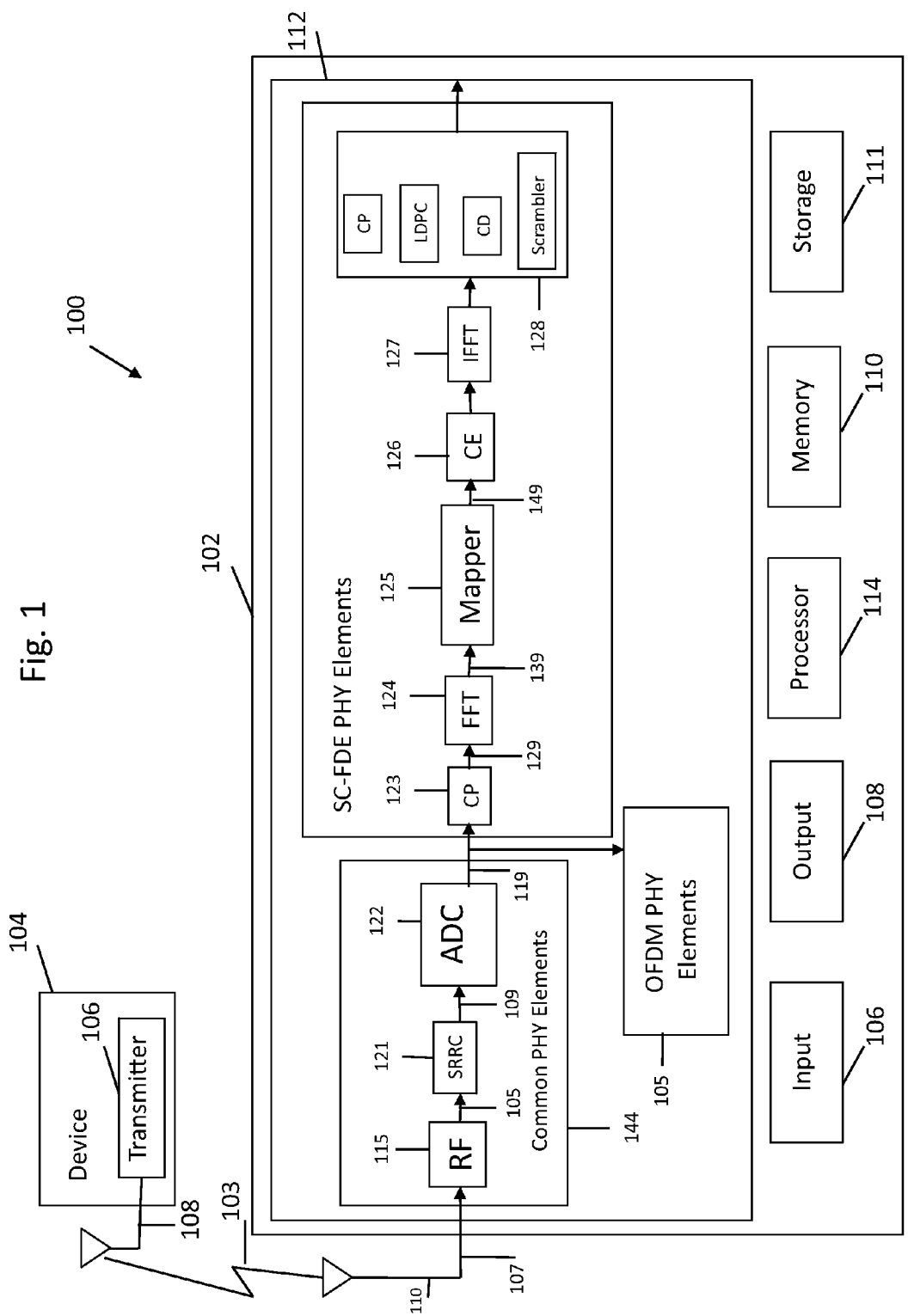

DEVICE, SYSTEM AND METHOD OF PROCESSING SINGLE-CARRIER WIRELESS COMMUNICATION SIGNALS

CROSS REFERENCE

This application is a National Phase Application of PCT International Application No. PCT/US2011/048492, International Filing Date Aug. 19, 2011, the entire disclosure of which is incorporated herein by reference.

BACKGROUND

Various modulation schemes may be implemented for wireless communication. For example, a first modulation scheme may include an Orthogonal-Frequency-Division-Multiplexing (OFDM) modulation scheme. A second modulation scheme may include a single-carrier (SC) modulation scheme, e.g., a SC with Frequency-Domain Equalization (SC-FDE) modulation scheme. Both communication schemes have utilities and deficiencies relative to each other.

Some wireless communication systems may implement two modulation schemes, e.g., both the OFDM and SC-FDE modulation schemes. For example, the IEEE 802.11 task group ad (TGAD) specification may utilize both the OFDM and SC-FDE modulation schemes. The implementation of several Physical (PHY) layer protocols to support the two different modulation schemes may complicate end product design.

The OFDM and SC-FDE modulation schemes utilize different sampling rates. Accordingly, the processing of OFDM and SC-FDE signals may require using two separate Analog to Digital Converters (ADCs), having two different sampling rates. However, the use of two ADCs may increase complexity. It may be advantageous to implement one ADC to apply the same sample rate for processing both SC-FDE and OFDM signals.

A receiver implementing the common ADC may utilize a sampling rate of the OFDM modulation scheme. For further processing of a SC-FDE signal sampled at the OFDM sampling rate, the receiver may utilize a resampling scheme in time-domain after the ADC, to convert between the OFDM and the SC-FDE sampling rates. For example, the receiver may insert zeroes between the samples to double the number of samples, may approximate the SC-FDE sample values in the positions of the inserted zeroes, and may sample the approximated samples at a reduced sampling rate, e.g., sampling every third sample. This approximation, which may a finite-length time-domain interpolation filter leads to performance degradation, e.g., in comparison with a theoretically ideal resampling scheme.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

FIG. 1 is a schematic block diagram illustration of a system, in accordance with some demonstrative embodiments.

DETAILED DESCRIPTION

Figure 2A:
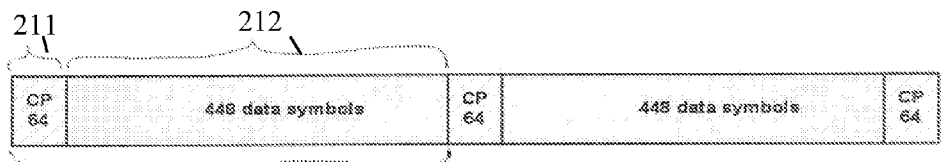
FIGS. 2A and 2B are schematic illustrations of a structure of a Single-Carrier Frequency Domain modulation (SC-FDE) signal sampled at a SC-FDE sampling rate, and a structure of a SC-FDE signal sampled at an Orthogonal-Frequency-Division-Multiplexing (OFDM) sampling rate, respectively, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein include, for example, "multiple" or "two or more". For example, "a plurality of items" includes two or more items.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a wired or wireless network, a wireless area network, a Wireless Video Area Network (WVAN), a Local Area Network (LAN), a Wireless LAN (WLAN), a Wireless Metropolitan Area Network (WMAN) communication system, a Personal Area Network (PAN), a Wireless PAN (WPAN), devices and/or networks operating in accordance with existing IEEE 802.11 standards ("the 802.11 standards"), e.g., including IEEE 802.11 (IEEE 802.11-2007: *Standard for Information technology—Telecommunications and information exchange between systems—Local and metropolitan area networks—Specific requirements, Part 11: Wireless LAN Medium Access Control (MAC) and Physical Layer (PHY) Specifications*—June 2007), 802.11n ("IEEE 802.11n-2009—*Amendment 5: Enhancements for Higher Throughput. IEEE-SA.* 29 Oct. 2009"), 802.11ac ("(*Very High Throughput <6 (Ghz*"), 802.11 task group ad (TGad) ("*Very High Throughput 60 GHz*"), and/or future versions and/or derivatives thereof, devices, and/or networks operating in accordance with IEEE 802.16 standards ("the 802.16 standards"), e.g., including 802.16 (*IEEE-Std 802.16, 2004 Edition, Air Interface for Fixed Broadband Wireless Access Systems*), 802.16d, 802.16e (*IEEE-Std 802.16e, 2005 Edition, Physical and Medium Access Control Layers for Combined Fixed and Mobile Operation in Licensed Bands*), 802.16f, 802.16m standards and/or future versions and/or derivatives thereof, devices, and/or networks operating in accordance with existing Wireless-Gigabit-Alliance (WGA) and/or WirelessHD™ specifications and/or future versions and/or derivatives thereof, devices and/or networks operating in accordance with existing cellular specifications and/or protocols, e.g., 3rd Generation Partnership Project (3GPP), 3GPP Long Term Evolution (LTE), and/or future versions and/or derivatives thereof, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

The term "wireless device" as used herein includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may be used to provide a wireless service.

Some demonstrative embodiments may be used in conjunction with a wireless communication network communicating over a frequency band of 60 GHz. However, other embodiments may be implemented utilizing any other suitable wireless communication frequency bands, for example, an Extremely High Frequency (EHF) band (the millimeter wave (mmwave) frequency band), e.g., a frequency band within the frequency band of between 30 Ghz and 300 GHZ, a WLAN frequency band, a WPAN frequency band, a frequency band according to the WGA specification, and the like.

Reference is now made to FIG. 1, which schematically illustrates a block diagram of a wireless communication system 100, in accordance with some demonstrative embodiments.

In some demonstrative embodiments, system 100 may include one or more devices, e.g., devices 102 and 104, capable of communicating wireless communication signals over a wireless communication channel 103. For example, device 104 may include a transmitter 106 capable of transmitting wireless signals via one or more antennas 108; and/or device 102 may include a receiver 112 capable of receiving the wireless signals over wireless channel 103 via one or more antennas 110.

In some demonstrative embodiments, wireless communication channel 103, may include, for example, a radio channel, an IR channel, a RF channel, a Wireless Fidelity (WiFi) channel, and the like.

In some demonstrative embodiments, antennas 108 and/or 110 may include any type of antennas suitable for transmitting and/or receiving wireless communication signals, blocks, frames, transmission streams, packets, messages and/or data. Types of antennas that may be used for antennas 108 and/or 110 may include but are not limited to internal antenna, dipole antenna, omni-directional antenna, a monopole antenna, an end fed antenna, a circularly polarized antenna, a micro-strip antenna, a diversity antenna, a phase array antenna and the like. In some embodiments, antennas 108 and/or 110 may implement transmit and receive functionalities using separate transmit and receive antenna elements. In some embodiments, antennas 108 and/or 110 may implement transmit and receive functionalities using common and/or integrated transmit/receive elements.

In some demonstrative embodiments, devices 102 and/or 104 may include, or may be included as part of, for example, a PC, a desktop computer, a mobile computer, a laptop computer, a notebook computer, a tablet computer, a server computer, a handheld computer, a handheld device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a STB, a BD player, a BD recorder, a DVD player, a HD DVD player, a DVD recorder, a HD DVD recorder, a PVR, a broadcast HD receiver, a video source, an audio source, a video sink, an audio sink, a stereo tuner, a broadcast radio receiver, a flat panel display, a PMP, a DVC, a digital audio player, a speaker, an audio receiver, a gaming device, an audio amplifier, a data source, a data sink, a DSC, a media player, a Smartphone, a television, a music player, or the like.

In some demonstrative embodiments, device 102 may also include, for example, one or more of a processor 114, an input unit 106, an output unit 108, a memory unit 110, and a storage unit 111. Device 102 may optionally include other suitable hardware components and/or software components. In some embodiments, some or all of the components of device 102 may be enclosed in a common housing or packaging, and may be interconnected or operably associated using one or more wired or wireless links. In other embodiments, components of device 102 may be distributed among multiple or separate devices or locations.

Processor 114 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 114 executes instructions, for example, of an Operating System (OS) of wireless communication device 102 and/or of one or more suitable applications.

Input unit 106 includes, for example, a keyboard, a keypad, a mouse, a touch-pad, a track-ball, a stylus, a microphone, or other suitable pointing device or input device. Output unit 108 includes, for example, a monitor, a screen, a flat panel display, a Cathode Ray Tube (CRT) display unit, a Liquid Crystal Display (LCD) display unit, a plasma display unit, one or more audio speakers or earphones, or other suitable output devices.

Memory unit 110 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 111 includes, for example, a hard disk drive, a floppy disk drive, a Compact Disk (CD) drive, a CD-ROM drive, a DVD drive, or other suitable removable or non-removable storage units. Memory unit 110 and/or storage unit 111, for example, may store data processed by wireless communication device 102.

In some demonstrative embodiments, device 102 may receive a wireless communication signal 107 via antennas 110 over wireless communication channel 103, e.g., from transmitter 106.

In some demonstrative embodiments, signal 107 may include a first wireless communication signal including a single-carrier (SC) analog signal sampled at a first sampling rate. For example, the first signal may represent a first plurality of time-domain samples at the first sampling rate.

In some demonstrative embodiments, signal 107 may include a second wireless communication signal including an analog signal sampled at a second sampling rate. For example, the second signal may represent a second plurality of time-domain samples at the second sampling rate, which is different from, e.g., greater than, the first sampling rate. For example, the second sampling rate may be equal to one and a half times the first sampling rate.

For example, the first signal may include a SC-FDE signal sampled at a SC-FDE sampling rate, and the second signal may include an OFDM signal sampled at an OFDM sampling rate.

In some demonstrative embodiments, device 102 may include one or more PHY elements configured to process signal 107. For example, device 102 may include one or more PHY elements configured to process the first signal, and/or one or more PHY elements configured to processing the second signal, e.g., as described below.

In some demonstrative embodiments, device 102 may include one or more common PHY elements 144 configured to process both the first and second signals. For example, one or more PHY elements 144, which may be configured to process the first signal, may also be capable of processing the second signal, e.g., as described in detail below.

In some demonstrative embodiments, common PHY elements 144 may include a common Analog to Digital Converter (ADC) 122, which may be configured to process the first signal and the second signal using a common sampling rate, e.g., the second sampling rate. It may be advantageous to implement one ADC element using the same sampling rate for sampling both the first and the second signals. For example, using two ADCs for the first and second, different, sampling rates may increase complexity.

In some demonstrative embodiments, receiver 102 may be implemented in a unified design for a better processing of the first signal and the second signal, e.g., with out any performance loss, in the frequency domain, e.g., as described below with reference to FIG. 7.

In some demonstrative embodiments, ADC 122 may convert the first wireless communication signal into a digital signal including a second plurality of time-domain samples at the second sampling rate.

In some demonstrative embodiments, device 102 may convert the digital signal, which includes the plurality of time-domain samples, into a first plurality of frequency-domain samples, and may map the first plurality of frequency-domain samples into a second plurality of frequency-domain samples at the first sampling rate, e.g., as described in detail below.

In one example, signal 107 may include an analog signal modulated using a SC-FDE modulation scheme, e.g., as defined by the IEEE 802.11TGad specification.

For example, transmitter 106 may include PHY elements configured to generate signal 107 according to the SC-FDE modulation scheme, e.g., having a sampling rate of 1.76 Gigahertz (GHz), a sampling time of 0.38 nanoseconds (ns), a Fast Fourier Transformation (FFT) size of 512, a Guard interval (GI) size of 64, an Inverse FFT (IFFT) and FFT period of 0.291 microseconds (μs) and a GI duration of 36.3 ns. For example, transmitter 106 may include a baseband chain including a scrambler, a Low Density Parity Checksum (LDPC) encoder, a constellation mapper and a framer configured to insert Cyclic Prefixes to form a SC-FDE structure, e.g., as described below.

Reference is now made to FIG. 2A, which schematically illustrates a structure 201 of a SC-FDE signal sampled at a SC-FDE sampling rate.

As shown in FIG. 2A, SC-FDE structure 201 may include a CP portion 211 followed by a data portion 212. For example, structure 201 may include five hundred and twelve symbols; CP portion 211 may include sixty four symbols, e.g., defined as a Golay sequence; and/or data portion 212 may include four hundred and forty eight data symbols.

Referring back to FIG. 1, transmitter 106 may also include, for example, a Digital to Analog Converter (DAC), a low pass Square Root Raised Cosine (SRRC) filter and a RF chain to transmit signal 107 corresponding to structure 201 (FIG. 2).

In a second example, signal 107 may include an analog signal modulated using the OFDM modulation scheme, e.g., as defined by the IEEE 802.11TGad specification.

For example, transmitter 106 may include PHY elements configured to generate signal 107 according to the OFDM modulation scheme, e.g., having a sampling rate of 2.64 GHz, a sampling time of 0.38 ns, a FFT size of 512, GI size of 128, a subcarrier frequency spacing of 5.15625 Megahertz (MHz), a IFFT and a FFT period of 0.194 μs and a GI duration of 48.4 ns.

For example, transmitter 106 may include a baseband chain, similar to that described above for SC-FDE modulation, including a scrambler, a Low Density Parity Checksum (LDPC) encoder, and a constellation mapper.

In some demonstrative embodiments, transmitter 106 may also include a DAC using an OFDM sampling rate, which is one and a half times the SC-FDE sampling rate, and a RF chain configured to transmit signal 107 including the OFDM signal.

In some demonstrative embodiments, common PHY elements 144 may be configured to process both OFDM signals and SC-FDE signals, e.g., both the OFDM and SC-FDE signals described above.

In some demonstrative embodiments, common PHY elements 144 may include one or more RF blocks 115 including common PHY RF chain elements, which may be configured to generate an analog signal 105 by processing signal 107.

In some demonstrative embodiments, receiver 112 may include a common filter 121 configured to filter signal 105 into a filtered signal 109, e.g., to perform a suitable pulse shaping of signal 105. For example, filter 121 may be implemented using a low pass Square Root Raised Cosine (SRRC) filter configured for a SC-FDE frequency band.

Figure 6:
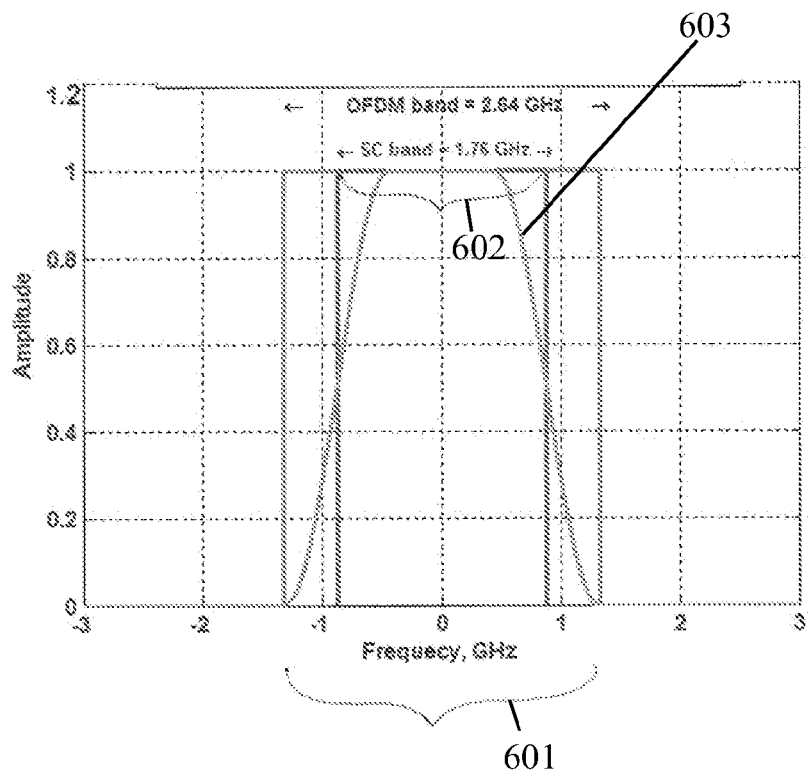
FIG. 6 is a schematic illustration of a graph depicting a frequency response function of a Square Root Raised Cosine (SRRC) filter, in comparison to SC-FDE and OFDM frequency bands, in accordance with some demonstrative embodiments.

Reference is now made to FIG. 6, which illustrates a combined frequency response function 603 of a SRRC filter having equal roll-off factors α=0.5 (equivalent RRC filter) in comparison with a OFDM frequency band 601 and a SC-FDE frequency band 602. For example, filter 121 (FIG. 1) may have frequency response function 603.

As shown in FIG. 6, the frequency response function 603 of the SRRC filter, e.g., filter 121 (FIG. 1), with equal roll-off factors α=0.5 utilized in SC-FDE PHY layer design, may be used for processing both OFDM and SC-FDE signals.

Referring back to FIG. 1, in some demonstrative embodiments, common ADC 122 may be configured to convert signal 109 into a digital signal 119 using a sampling rate different from the SC-FDE sampling rate. For example, ADC 122 may utilize an OFDM sampling rate, e.g., 2.64 GHz.

For example, signal 119 may include an SC-FDE signal sampled at the OFDM sampling rate. Accordingly, the structure of signal 119 may be different from the signal structure of the SC-FDE structure described above with reference to FIG. 2A.

Figure 2B:
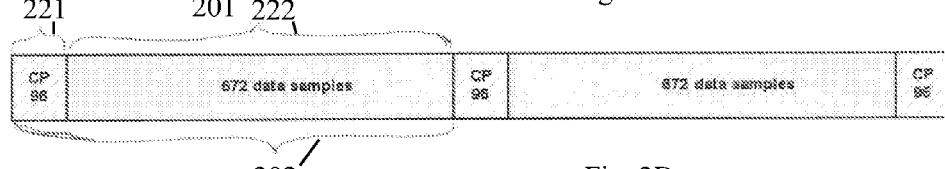

Reference is now made to FIG. 2B, which schematically illustrates a symbol structure 202 of a SC-FDE signal sampled at the OFDM sampling rate, in accordance with some demonstrative embodiments. For example, digital signal 119 may have symbol structure 202.

As shown in FIG. 2B, symbol structure 202 may include a CP portion 221 followed by a data portion 222. For example, structure 202 may include one and a half times the number of samples of structure 201 (FIG. 2A), e.g., seven hundred and sixty eight samples, which may result from sampling signal 109 at the OFDM sampling rate. According to this example, CP portion 221 may include ninety six samples, and data portion 222 may include six hundred and seventy two samples.

Referring back to FIG. 1, in some demonstrative embodiments, device 102 may include one or more SC-FDE PHY elements 147 configured to process signal 119, e.g., as described below.

In some demonstrative embodiments, receiver 122 may include a framer 123 configured to frame signal 119 into a signal 129 by removing CP portion 221 (FIG. 2B) from signal 119.

In some demonstrative embodiments, receiver 122 may include a converter 124 configured to convert the time-domain samples of signal 129 into a signal 139 including a first plurality of frequency-domain samples. For example, converter 124 may implement an extended FFT, having a FFT size which is one and a half times the FFT size of the SC-FDE signal, e.g., a FFT size of seven hundred and sixty eight. Accordingly, signal 139 may include seven hundred and sixty eight frequency-domain samples.

In some demonstrative embodiments, receiver 122 may include a mapper 125 configured to map signal 139 into signal 149 including a second plurality of frequency-domain samples at the SC-FDE sampling rate. For example, signal 149 may include five hundred and twelve frequency domain-samples. For example, mapper 125 may map the spectrum of signal 139 into an aliased SC-FDE spectrum, e.g., as described below with reference to FIG. 4.

In some demonstrative embodiments, receiver 122 may include one or more SC-FDE PHY elements for further processing of signal 149. For example, receiver 112 may include a Channel Equalizer (CE) 126, an IFFT converter 127, and one or more suitable time-domain elements 128.

In some demonstrative embodiments, receiver 112 may be capable of processing signal 107 including, for example, an OFDM signal sampled at the OFDM sampling rate.

In some demonstrative embodiments, receiver 112 may include one or more OFDM PHY elements 150 configured to process signal 107, e.g., as described below.

For example, OFDM elements 150 may include any suitable OFDM elements capable of processing OFDM signal 119 generated by ADC 122 corresponding to signal 107, when signal 107 includes an OFDM signal at the OFDM sampling rate.

Figures 3A, 3B:
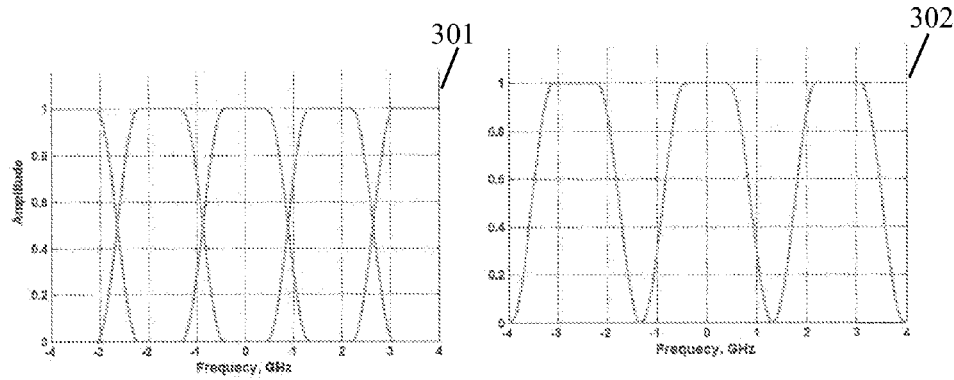
FIGS. 3A and 3B are schematic illustrations of a graph depicting a spectrum of the SC-FDE signal sampled at the SC-FDE sampling rate and a spectrum of the SC-FDE signal sampled at the OFDM sampling rate, in accordance with some demonstrative embodiments.

Reference is now made to FIGS. 3A and 3B which schematically illustrate a spectrum 301 of a SC-FDE signal sampled at a SC-FDE sampling rate, and a spectrum 302 of a SC-FDE signal sampled at an OFDM sampling rate, respectively, in accordance with some demonstrative embodiments.

In some demonstrative embodiments, signal 301 may be reconstructed from signal 302 by mapping samples of signal 302 according to a predefined mapping scheme, e.g., as described below with reference to FIG. 4.

Figure 4:
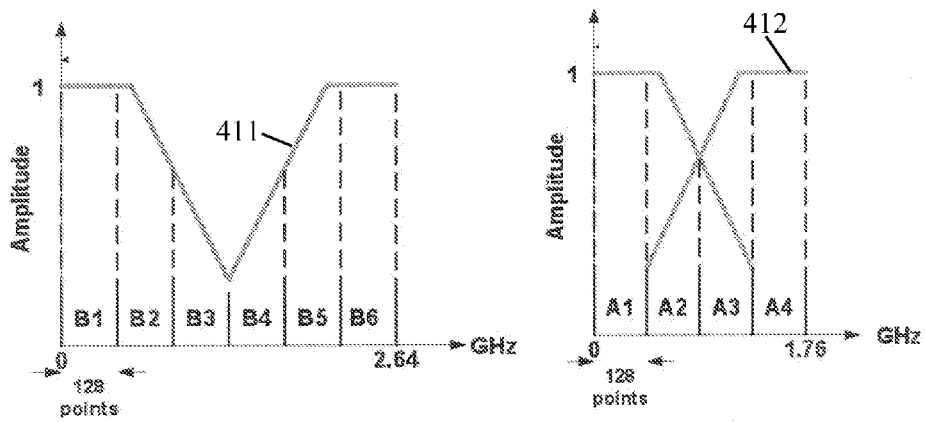
FIG. 4 is a schematic illustration of a mapping scheme, in accordance with some demonstrative embodiments.

Reference is now made to FIG. 4, which schematically illustrates a mapping scheme for mapping a spectrum 411 of the SC-FDE signal sampled according to the OFDM sampling rate to an aliased spectrum 412 corresponding to the SC-FDE sampling rate.

For example, mapper 125 (FIG. 1) may map signal 139 (FIG. 1) including seven hundred and sixty eight frequency-domain samples to signal 149 including five hundred and twelve frequency-domain samples.

As shown in FIG. 4, spectrum 411 may be divided into six sub-sets of frequency-domain samples, denoted 'B1-B6', respectively, and aliased spectrum 412 may include four sub-sets of frequency-domain samples, denoted 'A1-A4', respectively. The six sub-sets of spectrum 411 may have substantially the same size, e.g., a size of one hundred and twenty eight samples. The four subsets of spectrum 412 may have substantially the same size, e.g., a size of one hundred and twenty eight samples.

In some demonstrative embodiments, mapper 125 (FIG. 1) may map the six sub-sets of spectrum 411 into the four sub-sets of spectrum 412. Mapper 125 (FIG. 1) may determine at least one subset of spectrum 412 by combining at least two subsets of spectrum 411, e.g., as described below.

In some demonstrative embodiments, mapper 125 (FIG. 1) may map the six sub-sets of spectrum 411 into the four sub-sets of spectrum 412, for example, by mapping first sub-set, B1, of spectrum 411 to first sub-set, A1, of spectrum 412; by mapping second and fourth sub-sets, B2 and B4 respectively, of spectrum 411 to second sub-set, A2, of spectrum 412; by mapping third and fifth sub-sets, B3 and B5 respectively, of spectrum 411 to third sub-set, A3, of spectrum 412; and by mapping sixth sub-set, B6, of spectrum 411 to fourth sub-set, A4, of spectrum 412.

For example, mapper 125 may map the six sub-sets of spectrum 411 into the four subsets of spectrum 412, e.g., as follows:

$$A_1 = B_1,$$
$$A_2 = B_2 + B_4$$
$$A_3 = B_3 + B_5$$
$$A_4 = B_6 \quad (1)$$

Figure 5:
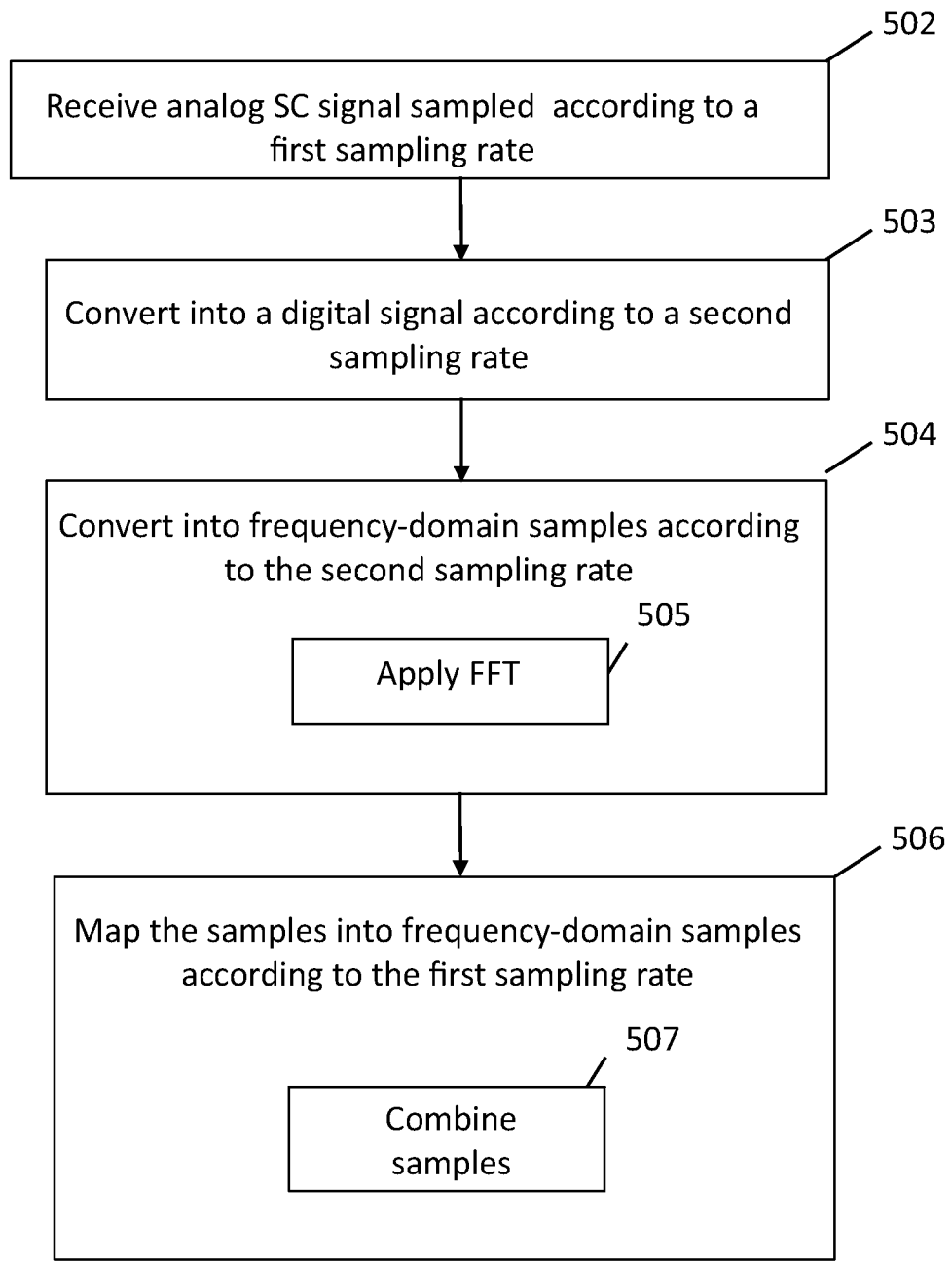
FIG. 5 is a schematic flow chart illustration of a method of processing a single-carrier wireless communication signal, in accordance with some demonstrative embodiments.

Reference is made to FIG. 5, which schematically illustrates a method of processing a wireless communication signal, in accordance with some demonstrative embodiments. In some embodiments, one or more of the operations of the method of FIG. 5 may be performed by any suitable wireless communication system, e.g., system 100 (FIG. 1); wireless communication device, e.g., device 102 (FIG. 1); and/or wireless communication unit, e.g., receiver 112 (FIG. 1).

As indicated at block 502, the method may include receiving an analog single-carrier wireless communication signal representing a first plurality of time-domain samples including a first number of samples sampled at a first sampling rate. For example, device 102 may receive analog SC-FDE signal 107 (FIG. 1) which may represent five hundred and twelve time-domain samples sampled at a sampling rate of 1.76 GHz, e.g., as described above.

As indicated at block 503, the method may include converting the analog single-carrier wireless communication signal into a digital signal including a second plurality of time-domain samples including a second number of samples sampled at a second sampling rate, which is greater than the first sampling rate. For example, ADC 122 (FIG. 1) may convert analog signal 109 (FIG. 1) into a digital signal 119 (FIG. 1), including seven hundred and sixty eight time-domain samples using the OFDM sampling rate, e.g., 2.64 GHz, as described above.

As indicated at block 504, the method may include converting the time-domain samples into a first plurality of frequency-domain samples including the second number of samples. For example, transformer 124 (FIG. 1) may transform the time-domain samples of signal 129 (FIG. 1) into signal 139 (FIG. 1) including seven hundred and sixty eight frequency-domain samples, e.g., as described above.

As indicated at block 505, converting the time-domain samples into the frequency-domain samples may include applying a fast-Fourier-transform to the time-domain samples. For example, transformer 124 (FIG. 1) may implement a Fast Fourier Transform (FFT) having a FFT size of seven hundred and sixty eight samples, e.g., as described above.

As indicated at block 506, the method may include mapping the first plurality of frequency-domain samples into the second plurality of frequency-domain samples including the first number of samples. For example, mapper 125 (FIG. 1) may map signal 139 (FIG. 1), including seven hundred and sixty eight frequency-domain samples, into signal 149 (FIG. 1), including five hundred and twelve frequency domain-samples, e.g., as described above.

As indicated at block 507, mapping the first plurality of frequency-domain samples into the second plurality of frequency-domain samples may include determining at least one subset of the second plurality of frequency-domain samples by combining at least two subsets of the first plurality of frequency-domain samples. For example, mapper 125 (FIG. 1) may map the six sub-sets of spectrum 411 (FIG. 4A) into the four subsets of spectrum 412 (FIG. 4B), and may determine at least one subset of spectrum 412 (FIG. 4B) combined from at least two subsets of spectrum 411 (FIG. 4A), e.g., as described above.

Figure 7:
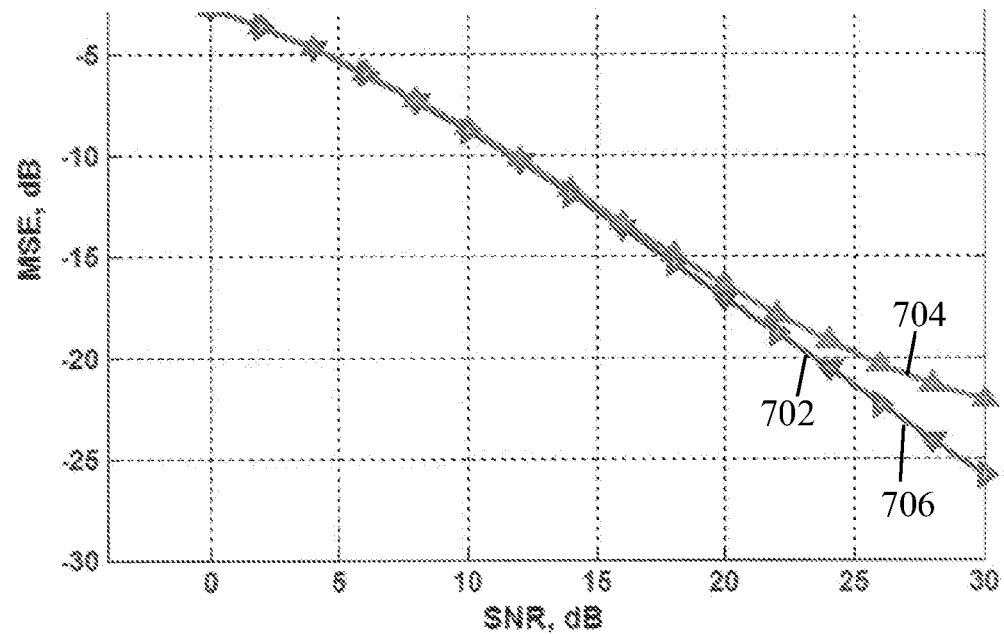
FIG. 7 is a schematic illustration of a graph depicting three receiver performance curves, corresponding to a time-domain theoretic resampling scheme, an approximated time-domain resampling scheme, and a frequency-domain resampling scheme, respectively, in accordance with some demonstrative embodiments.

Reference is made to FIG. 7, which schematically illustrates a graph depicting receiver performance curves 702, 704 and 706, corresponding to three respective receiver schemes, in accordance with some demonstrative embodiments. For example, performance curves 702, 704 and 706 may represent performance curves of three respective resampling schemes for resampling SC-FDE signals sampled at the OFDM sampling rate.

Performance curves 702, 704 and 706 represent Mean-Square-Error (MSE) values after equalization, e.g., Channel Equalizer (CE) 126 (FIG. 1), versus Signal-Noise Ratio (SNR).

Curve 702 corresponds to a receiver implementing a time-domain theoretic resampling scheme, e.g., using a Whittaker-Shannon interpolation formula, which uses an infinite length and, accordingly, requires a filter in time-domain having an infinite number of coefficients.

Since implementing the theoretical resampling scheme may be impossible, some receivers may implement a time-domain approximated resampling scheme having a finite length and a finite number of coefficients. For example, curve 704 corresponds to a receiver implementing an approximated time-domain resampling scheme, e.g., utilizing an interpolation filter with a finite number of coefficients. Curve 706 corresponds to a receiver implementing a frequency-domain resampling scheme in accordance with some demonstrative embodiments, e.g., as described above.

It may be seen from FIG. 7, that the approximated resampling scheme, represented by curve 704, may lead to performance degradation in comparison to the theoretic sampling scheme in time-domain, e.g., as represented by curve 702. Conversely, curve 706, which represents a resampling scheme in frequency-domain, may have almost equivalent performance to the theoretical resampling scheme in time-domain.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A wireless communication device comprising:
a receiver to receive an analog single-carrier wireless communication signal representing a first plurality of time-domain samples at a first sampling rate; to convert said analog single-carrier wireless communication signal into a digital signal including a second plurality of time-domain samples at a second sampling rate, which is greater than said first sampling rate; to convert said second plurality of time-domain samples into a first plurality of frequency-domain samples; and to map said first plurality of frequency-domain samples into a second plurality of frequency-domain samples at said first sampling rate.

2. The wireless communication device of claim 1, said receiver is to determine at least one subset of said second plurality of frequency-domain samples by combining at least two subsets of said first plurality of frequency-domain samples.

3. The wireless communication device of claim 2, wherein said first plurality of frequency-domain samples comprises six sub-sets of frequency-domain samples, wherein said second plurality of frequency-domain samples comprises four sub-sets of frequency-domain samples, and wherein mapping said first plurality of frequency-domain samples comprises mapping a first sub-set of said six subsets to a first sub-set of said four sub-sets, mapping second and fourth sub-sets of said six subsets to a second sub-set of said four sub-sets, mapping third and fifth sub-sets of said six subsets to a third sub-set of said four sub-sets, and mapping a sixth sub-set of said six subsets to a fourth sub-set of said four sub-sets.

4. The wireless communication device of claim 3, wherein a size of each of said six sub-sets of frequency-domain samples is equal to a size of each of said four sub-sets of frequency-domain samples.

5. The wireless communication device of claim 1, wherein said second sampling rate is at least one and a half times said first sampling rate.

6. The wireless communication device of claim 5, wherein said first plurality of time-domain samples includes five hundred and twelve samples and said second plurality of time-domain samples includes seven hundred and sixty eight samples.

7. The wireless communication device of claim 1, wherein said single-carrier wireless communication signal comprises a single carrier with frequency-domain-equalization signal.

8. The wireless communication device of claim 1, wherein said receiver is to convert said second plurality of time-domain samples into said first plurality of frequency-domain samples by applying a fast-Fourier-transform to said second plurality of time-domain samples.

9. The wireless communication device of claim 1, wherein said first sampling rate comprises a sampling rate of an orthogonal-frequency-division-multiplexing scheme.

10. A method comprising:
receiving an analog single-carrier wireless communication signal representing a first plurality of time-domain samples including a first number of samples at a first sampling rate;
converting said analog single-carrier wireless communication signal into a digital signal including a second plurality of time-domain samples including a second number of samples at a second sampling rate, which is greater than said first sampling rate;
converting said second plurality of time-domain samples into a first plurality of frequency-domain samples including said second number of samples; and
mapping said first plurality of frequency-domain samples into a second plurality of frequency-domain samples including said first number of samples.

11. The method of claim 10 wherein mapping said first plurality of frequency-domain samples comprises determining at least one subset of said second plurality of frequency-domain samples by combining at least two subsets of said first plurality of frequency-domain samples.

12. The method of claim 11, wherein said first plurality of frequency-domain samples comprises six sub-sets of frequency-domain samples, wherein said second plurality of frequency-domain samples comprises four sub-sets of frequency-domain samples, and wherein mapping said first plurality of frequency-domain samples comprises mapping a first sub-set of said six subsets to a first sub-set of said four sub-sets, mapping second and fourth sub-sets of said six subsets to a second sub-set of said four sub-sets, mapping third and fifth sub-sets of said six subsets to a third sub-set of said four sub-sets, and mapping a sixth sub-set of said six subsets to a fourth sub-set of said four sub-sets.

13. The method of claim 12, wherein a size o each of said six sub-sets of frequency-domain samples is equal to a size of each of said four sub-sets of frequency-domain samples.

14. The method of claim 10, wherein said second number is at least one and a half times said first number.

15. The method of claim 14, wherein said first number is five hundred and twelve and said second number is seven hundred and sixty eight.

16. The method of claim 10, wherein said single-carrier wireless communication signal comprises a single carrier with frequency-domain-equalization signal.

17. The method of claim 10, wherein converting said second plurality of time-domain samples into said first plurality of frequency-domain samples comprises applying a fast-Fourier-transform to said second plurality of time-domain samples.

18. The method of claim 17, wherein said fast-Fourier-transform has a size equal to said second number.

19. The method of claim 10, wherein said first sampling rate comprises a sampling rate of an orthogonal-frequency-division-multiplexing scheme.

* * * * *